(12) United States Patent
Smith et al.

(10) Patent No.: US 8,076,650 B2
(45) Date of Patent: Dec. 13, 2011

(54) MULTI-SOURCE PLASMA FOCUSED ION BEAM SYSTEM

(75) Inventors: Noel Smith, Lake Oswego, OR (US);
Clive D. Chandler, Portland, OR (US);
Mark Utlaut, Scappoose, OR (US);
Paul P. Tesch, Portland, OR (US); Dave Tuggle, Portland, OR (US)

(73) Assignee: FEI Company, Hillsboro, OR (US)

( * ) Notice: Subject to any disclaimer, the term of this patent is extended or adjusted under 35 U.S.C. 154(b) by 63 days.

(21) Appl. No.: 12/373,676

(22) PCT Filed: Jul. 16, 2007

(86) PCT No.: PCT/US2007/073618
§ 371 (c)(1),
(2), (4) Date: Jul. 31, 2009

(87) PCT Pub. No.: WO2008/094297
PCT Pub. Date: Aug. 7, 2008

(65) Prior Publication Data
US 2009/0309018 A1 Dec. 17, 2009

Related U.S. Application Data

(60) Provisional application No. 60/830,978, filed on Jul. 14, 2006.

(51) Int. Cl.
*G21G 5/00* (2006.01)
(52) U.S. Cl. ............ 250/423 R; 250/492.21; 250/492.3; 250/423 F
(58) Field of Classification Search ............. 250/492.21, 250/492.3, 423 F, 423 R
See application file for complete search history.

(56) References Cited

U.S. PATENT DOCUMENTS

| | | | |
|---|---|---|---|
| 4,859,908 A | 8/1989 | Yoshida et al. | |
| 4,870,284 A | 9/1989 | Hashimoto et al. | |
| 4,874,459 A | 10/1989 | Coldren et al. | |
| 5,036,252 A | 7/1991 | Lob | |
| 5,055,696 A | 10/1991 | Haraichi et al. | |
| 5,108,535 A | 4/1992 | Ono et al. | |

(Continued)

FOREIGN PATENT DOCUMENTS

JP 03-272549 12/1991

(Continued)

OTHER PUBLICATIONS

Coupland, J.R., T.S. Green, D.P. Hammond, and A.C. Riviere, 'A Study of the Ion Beam Intensity and Divergence Obtained from a Single Aperture Three Electrode Extraction System,' American Institute of Physics, Sep. 1973, vol. 44, No. 9, pp. 1258-1270.

(Continued)

*Primary Examiner* — David A Vanore
(74) *Attorney, Agent, or Firm* — Scheinberg & Griner, LLP; Michael O. Scheinberg; David Griner

(57) ABSTRACT

The present invention provides a plasma ion beam system that includes multiple gas sources and that can be used for performing multiple operations using different ion species to create or alter submicron features of a work piece. The system preferably uses an inductively coupled, magnetically enhanced ion beam source, suitable in conjunction with probe-forming optics sources to produce ion beams of a wide variety of ions without substantial kinetic energy oscillations induced by the source, thereby permitting formation of a high resolution beam.

29 Claims, 7 Drawing Sheets

U.S. PATENT DOCUMENTS

| | | | |
|---|---|---|---|
| 5,149,974 A * | 9/1992 | Kirch et al. | 250/492.2 |
| 5,188,705 A | 2/1993 | Swanson et al. | |
| 5,591,970 A * | 1/1997 | Komano et al. | 850/12 |
| 5,683,547 A | 11/1997 | Azuma et al. | |
| 5,686,796 A | 11/1997 | Boswell et al. | |
| 5,700,526 A * | 12/1997 | Ximen et al. | 427/527 |
| 5,945,677 A | 8/1999 | Leung et al. | |
| 6,127,275 A | 10/2000 | Flamm | |
| 6,239,404 B1 | 5/2001 | Lea et al. | |
| 6,639,226 B2 | 10/2003 | Morio et al. | |
| 6,770,836 B2 | 8/2004 | Kwon et al. | |
| 6,833,051 B2 | 12/2004 | Kazumi et al. | |
| 6,838,380 B2 | 1/2005 | Bassom et al. | |
| 6,897,157 B2 | 5/2005 | Liang et al. | |
| 6,975,072 B2 | 12/2005 | Leung et al. | |
| 7,084,407 B2 | 8/2006 | Ji et al. | |
| 7,176,469 B2 | 2/2007 | Leung et al. | |
| 7,241,361 B2 | 7/2007 | Keller et al. | |
| 7,287,840 B2 * | 10/2007 | Miyazawa et al. | 347/68 |
| 7,291,959 B2 * | 11/2007 | Miyazawa et al. | 310/358 |
| 7,494,937 B2 * | 2/2009 | Clark | 438/778 |
| 7,531,452 B2 * | 5/2009 | Clark | 438/656 |
| 7,732,759 B2 * | 6/2010 | Chen et al. | 250/251 |
| 7,776,156 B2 * | 8/2010 | Long et al. | 118/725 |
| 2004/0048398 A1 * | 3/2004 | Liang et al. | 438/3 |
| 2005/0098118 A1 | 5/2005 | Amann et al. | |
| 2005/0183667 A1 * | 8/2005 | Keller et al. | 118/723 I |

FOREIGN PATENT DOCUMENTS

| | | |
|---|---|---|
| JP | 04-343040 | 11/1992 |
| JP | 6176725 | 6/1994 |
| JP | 7312201 | 11/1995 |
| JP | 7335163 | 12/1995 |

OTHER PUBLICATIONS

Hopwood, J., "A Microfabricated Inductively-Coupled Plasma Generator," Journal of Microelectronmechanical Systems, 2000, pp. 309-313, vol. 9, Iss. 3.

Jiang, X., et al, 'Mini Rf-Driven Ion Sources for Focused Ion Beam Systems,' Review of Scientific Instruments, Apr. 2003, pp. 2288-2292, vol. 74, No. 4.

Johnson, Wayne, 'Electrostatically-Shielded Inductively-Coupled RF Plasma Sources,' High Density Plasma Sources, Ed. Oleg A. Popov, 1995, pp. 100-148.

Leung, Ka-Ngo, "Plasma Sources for Electrons and Ion Beams," J. Vac. Sci. Technol. B, Nov./Dec. 1999, pp. 2776-2778, vol. 17, Iss. 6.

Lieberman, M.A., et al., Principles of Plasma Discharges and Materials Processing, 1994, pp. 31-37, pp. 157-163, 1st Edition, John Wiley & Sons, New York.

Yin, Y., et al.; "Miniaturization of Inductively Coupled Plasma Sources," IEEE Trans. Plasma Science, 1992, pp. 109-116, vol. 27, No. 5.

Alanko, T., et al., 'Simultaneous Wide-Range Stopping Power Determination for Several Ions,' Nuclear Instruments and Methods in Physics Research B, 2002, pp. 60-63, vol. 190.

Koivisto, H. et al., 'Electron Cyclotron Resonance Ion Source Related Development work for Heavy-Ion Irradiation Tests,' Review of Scientific Instruments, 2006, 3 pp, vol. 77.

Virtanen, A., et al., 'Heavy Ion and Proton Test Site at JYFL-Accelerator Laboratory,' Nuclear Instruments and Methods in Physics Research A, 1999, pp. 68-71, vol. 426.

* cited by examiner

MULTI-SOURCE PLASMA FOCUSED ION BEAM SYSTEM

TECHNICAL FIELD OF THE INVENTION

The present invention relates to the field of ion beam systems.

BACKGROUND OF THE INVENTION

A typical focused ion beam (FIB) system using a gallium liquid metal ion source (LMIS) can provide five to seven nanometers of lateral resolution. Such systems are widely used in the characterization and treatment of materials on microscopic to nanoscopic scales. A gallium LMIS typically comprises a pointed needle coated with a layer of gallium. The needle may be maintained at a high temperature while an electric field is applied to extract ions from the source.

FIB systems with gallium LMIS's are used in many applications because of their ability to image, mill, deposit, and analyze with great precision. Milling or micromachining involves the removal of bulk material at or near the surface. Milling can be performed without an etch-assisting gas, in a process called sputtering, or using an etch-assisting gas, in a process referred to as chemically-assisted ion beam etching. U.S. Pat. No. 5,188,705, which is assigned to the assignee of the present invention, describes a chemically-assisted ion beam etching process. In chemically-assisted ion beam etching, an etch-enhancing gas reacts in the presence of the ion beam to combine with the surface material to form volatile compounds. In FIB deposition, a precursor gas, such as an organometallic compound, decomposes in the presence of the ion beam to deposit material onto the target surface.

In ion beam-assisted deposition and etching, a gas is adsorbed onto the specimen surface and reacts in the presence of the ion beam. The rate of material removal or deposition depends on the number of ions striking the target surface, the rate at which gas molecules are adsorbed by the surface, and the number of atoms removed or deposited by each ion.

In all of the processes described above, the function of the gallium ions in the beam is to provide energy, either to displace particles on the work piece in sputtering or to activate a chemical reaction of a molecule adhered to the surface. The gallium itself does not typically participate in the reaction. Gallium is used in the beam because its properties, such as melting point, ionization energy, and mass, make it suitable to form into a narrow beam to interact with commonly used work piece materials.

There are disadvantages to using LMIS'S. With regard to chemically-assisted etching or deposition, because the gallium itself merely provides energy for the reaction and does not otherwise participate, the reaction rate is limited by adsorption rate of the reacting molecules. For example, in FIB deposition, if the ion beam dwells too long at a point, the adsorbed gas molecules are all decomposed and the beam begins to etch, rather than deposit. To mill or deposit, the ion beam is typically scanned repeatedly over a rectangle in a raster pattern. As the beam completes a scan, the beam is typically delayed for a significant amount of time before beginning the next scan to provide time for additional gas molecules to adsorb onto the surface before beginning a new raster. This increases processing time.

Moreover, gallium atoms implant into the work piece and, in many applications, produce undesirable side effects, such as changing the opacity or electrical properties of a work piece. Gallium can also disrupt the crystal structure in the area of bombardment. The type of ion emitted from a LMIS cannot be readily changed, which is a disadvantage because different ion species may be preferred for different processes. To change the ion species, the source must be removed from the vacuum chamber and replaced with a different source, which must then undergo a time consuming preparation procedure. Also, to produce a very narrow beam, the current in a beam from an LMIS must be kept relatively low, which means low etch rates and longer processing times.

Plasma etch systems used in semiconductor manufacturing, unlike beams of gallium atoms, typically use ions in a plasma to chemically react with the work piece. Such systems, however, typically provide a reactive plasma over the entire surface of a wafer and are not used to locally etch or deposit fine features.

Plasma ion sources have been used to form ion beams, but such beams are not typically used to mill or deposit fine features on a work piece because beams from plasma ion sources were difficult to focus into a fine spot while maintaining a useful beam current. Such beams were typically used either to broadly etch a large area, such as to thin samples for viewing on a transmission electron microscope, or to produce a small spot size at low beam current, for example, for secondary ion mass spectroscopy analysis. Moreover, such plasma sources are limited to the specific types of gases and the lifetime of such sources are relatively short with some gases because the plasma would corrode the cathode.

The magnetically enhanced, inductively coupled plasma ion source described in U.S. Pat. Appl. Publ. No. 2005/0183667 for a "Magnetically enhanced, inductively coupled plasma source for a focused ion beam system" can be used to produce a finely focused beam with a relatively large beam current, thereby overcoming many of the problems of a gallium LMIS system. U.S. Pat. Appl. Publ. No. 2005/0183667 describes a system using a single ion species.

There is a need for a system that enables the user to selectively provide gases of different ion species for performing different treatments of a specimen such as milling, etching, deposition and imaging, without requiring replacing the source.

SUMMARY OF THE INVENTION

Embodiments of the invention provide a method and apparatus for performing multiple charged particle beam operations on a work piece and provide for the use of different types of charged particles to operate on a work piece in a single system. The invention facilitates sequentially or simultaneously using different ion species to perform various processes on a work piece. The different processes can be performed with the most appropriate charged particle species for that particular process.

For example, an inert ion specie can be used to sputter or to activate an etch-enhancing gas or a deposition precursor gas adsorbed onto the substrate. In another example, the charged particle beam itself may include an etch-enhancing gas or a deposition precursor gas, thereby eliminating the necessity of using a beam of one species to provide the activation energy for a compound introduced through a gas injection system. In yet another example, the beam species can comprise a material to be directly deposited.

A preferred system uses a magnetically enhanced, inductively coupled plasma ion source, which provides a high brightness beam that can be focused onto a small spot and that can provide beams of a wide variety of ion species by inputting different gases into the source.

The foregoing has rather broadly outlined some features and technical advantages of the present invention in order that the detailed description of the invention that follows may be better understood. Additional features and advantages of the invention will be described hereinafter. It should be appreciated by those skilled in the art that the conception and specific embodiment disclosed herein may be readily utilized as a basis for modifying or designing other structures for carrying out many useful purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1A:
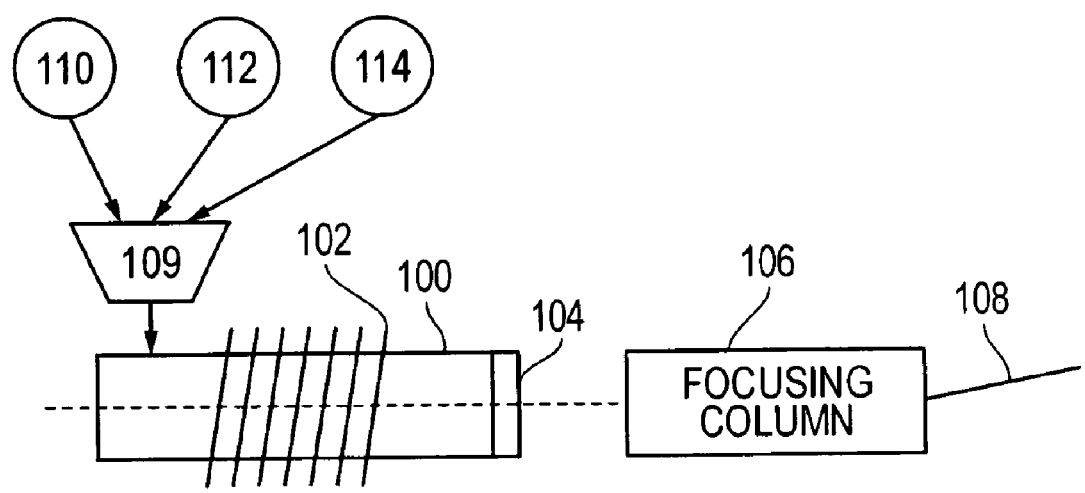
FIG. 1A shows a simplified schematic diagram of a multi-source, RF-excited, plasma ion chamber.

The following is a detailed description of example embodiments of the invention depicted in the accompanying drawings. The example embodiments are in such detail as to clearly communicate the invention. However, the amount of detail offered is not intended to limit the anticipated variations of embodiments; on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Embodiments of the invention provide for processing of submicron features using charged particle beams. In a preferred embodiment, a work piece can be sequentially processed with relatively high current using submicron beams of different ion species, without removing the work piece from the vacuum chamber and without having to change the ion source, that is, the plasma chamber. The ion specie is changed by feeding different gases into the ion source. Preferred embodiments can provide a wide range of ion species for different types of processing. For example, an inert ion, such as xenon or helium, can be used to sputter or to activate an etch-enhancing gas, such as iodine, chlorine, or xenon difluoride, the etch-enhancing gas typically being introduced into the vacuum chamber by a gas injection system separate from the ion beam source.

An inert ion specie can also be used to activate a deposition precursor gas that decomposes in the presence of the ion beam to deposit a material, such as a conductor or an insulator, onto the work piece. Using an inert ion specie can eliminate contamination caused by implanting the ions into the deposited material and the work piece. Many deposition precursor gases are known, including tetramethylorthosilane (TMOS), tetraethylorthosilane (TEOS), tetrabutoxysilane $Si(OC_4H_9)$, tungsten hexafluoride $(WF_6)$, organometallic compounds, such as tungsten hexacarbonyl $(W(CO)_6)$ and $C_7H_{17}Pt$.

Embodiments can also feed an etch-enhancing gas or a deposition precursor gas, such as those described above, into the ion source to form the beam, alone or in combination with other gases, such as inert gases. Using an etch-enhancing gas or a deposition precursor gas as an ion specie in the beam eliminates the necessity of introducing one gas through a gas injection system and eliminates the problem of the exhaustion of adsorbed gas molecules by the ion beam.

Embodiments can also use an ion specie in the beam that comprises the material to be deposited, analogous to spray painting the work piece with the material in the beam. For example, a beam of carbon 60 $(C_{60})$ can be used to deposit carbon, to make a portion of photolithography mask opaque or to provide a protective layer on a surface. The ion beam could also include mixtures of different species. For example, a metallic deposition precursor gas and an insulator precursor gas source can be used together, to provide a beam that deposits a high resistivity material, such as that described in U.S. Pat. No. 6,838,380, to Bassom et al. for "Fabrication of High Resistivity Structures using Focused Ion Beams," which is assigned to the assignee of the present invention.

The present invention facilitates multi-step processing by allowing the ion species to be changed without having to remove the ion source, expose the vacuum chamber to atmosphere, and reinstall a new ion source. Thus, for example, the system can be used to sequentially, etch, image, deposit, image and etch. These steps can be performed in any preferred order. The ion species can be changed by simply switching the gas input into the ion source. A vacuum pump can exhaust the remaining amounts of the previous ion species in the plasma chamber and the sample chamber. In preferred embodiments, the work piece can remain in the sample chamber for multiple processing steps using different ion species. Some embodiments will also permit electron beam processing, for example, for electron microscopy, e-beam assisted etching, or e-beam assisted deposition.

Multi-step processes may involve, for example, coating a material with a protective or conductive layer using a first inert ion species together with a precursor gas delivered through a gas injection system or in the beam, milling a trench in the work piece using a second, heavier inert ion specie together with an etch-enhancing gas introduced using a gas injection system or in the beam to expose a cross section, and then using a beam of light inert atoms or electrons to form an image of the exposed cross section using scanning ion microscopy. A heavier inert ion specie can be used in the beam to sputter the surface to perform secondary ion mass spectroscopy to determine the surface composition.

In accordance with one preferred method of the invention, an RF-excited, impedance-matched plasma chamber receives a gas from one or more of multiple available gas sources, and extracts an ion beam from the chamber. Ions can also be implanted into a substrate to charge its electrical properties using gases such as $AsH_3$, $PH_3$ and $BF_3$. The method further comprises introducing and ionizing a first gas for performing a first operation and performing the first operation with a beam formed of ionized particles of the first gas. Then, a chamber holding the specimen is substantially evacuated of the first gas and ionized particles and a second gas for a second operation is introduced and ionized.

Another embodiment comprises providing a plurality of different gas sources to be selectively coupled to a plasma chamber. One of a plurality of source gases is selectively coupled to the plasma chamber for a first process, and then, for a subsequent process, another gas is selectively coupled to the plasma chamber. A radio frequency (RF) source is applied to an antenna that couples energy to the selected gas within the chamber to induce ionization of the gas to produce an ion plasma. Circuitry is provided that couples the RF source to the antenna to reduce modulation of a plasma potential. An extraction mechanism extracts an ionized beam from a region of extraction in proximity to the antenna.

Another embodiment is an ion beam system for treatment of a work piece using beams containing different ions. The embodiment comprises a gas coupled to an electromagnetic field from a helical antenna positioned around the plasma chamber and excited to ionize the gas within the plasma chamber. Circuitry in a network comprising the antenna impedance matches a source of excitation to the antenna. An extraction mechanism extracts an ionized beam to be directed onto a specimen. A first gas is selectively fed into the ion chamber for a first processing operation, and than a second gas is selectively fed into the ion chamber for a second operation.

Preferred embodiments of the present invention include a multi-source, inductively coupled, magnetically enhanced ion beam source, suitable to be used in conjunction with probe-forming optics to produce ion beams without substantial kinetic energy oscillations induced by the source. One of many advantages of the use of an inductively coupled, magnetically enhanced ion beam source, suitable to be used in conjunction with probe-forming optics is the ability to apply different ion species for different purposes, without having to remove the sample from the vacuum chamber and without having to replace the ion source. Another of the many advantages is the relatively long lifetime of the inventive apparatus, in comparison to cathode sources for ionization of a gas.

Another advantage of some embodiments of the invention is the fast deposition rates that can be achieved using different ion species for direct deposition in contrast to using a beam to merely induce reaction of precursor gases introduced into the sample vacuum chamber through a gas injection system. Another advantage of some embodiments of the invention is the high deposition rates or etch rates that can be achieved using precursor gases or etch enhancing gases in the ion beam itself in contrast to introducing precursor gases or etch enhancing gases into the sample vacuum chamber through a gas injection system. Another advantage of some embodiments of the invention is the reduction or elimination of contamination when using a beam of inert ions, as oppose to metal ions, together with a precursor gas or etch-enhancing gas introduced through a gas injection system. Another advantage of some embodiments of the invention is the ability to select an ion specie of an appropriate mass for processing, such as a relatively heavy species when it is desired to eject material near a work piece surface, or a lighter ion when it is desirable that the beam penetrate further into the work piece. Other advantages will be apparent from the following description.

In various embodiments, the processing operations may include, for example, deposition, milling, imaging, analyzing, implanting, or other operations. The beam can be composed, for example, of ions that interact chemically with the work piece material, ions that provide energy to sputter or induce chemical reactions, or both. As used herein, "a gas" may include a mixture of different compounds and is not limited to a single molecular or atomic species. The ion beam can include, for example, combinations of inert ions, precursors that decompose to deposit material, material to be directly deposited, reactive materials that combine with the work piece surface materials to form volatile compounds that are removed from the system by the vacuum pump, reactive materials that combine with the work piece surface materials to form non-volatile compounds, such as oxides or nitrides, that remain on the surface, or other ions.

FIG. 1A shows a simplified schematic diagram of a multi-source, RF excited, plasma ion chamber. A ceramic plasma ion chamber 100 is wrapped by a coil 102. The coil is excited by an RF source, (not shown in FIG. 1A). Ceramic plasma ion chamber 100 is a cylinder with aperture electrodes 104 at one end. The aperture electrodes 104 exhibit an aperture centered on the cylinder axis of ceramic plasma ion chamber 100. An ion beam leaves ceramic plasma ion chamber 100 through the aperture of the electrodes 104 and passes through an ion beam focusing column 106 to produce a deflectable focused ion beam 108.

Ceramic plasma ion chamber 100 receives through a valve 109, gas from one or more of a plurality of sources 110, 112, 114. Sources may comprise inert gases such as xenon (Xe) or helium (He), reactive gases such as oxygen ($O_2$), or precursor or etch-enhancing gases as described above. Valve 109 may be provided to select in sequence or in combination each of a plurality of different gases from the sources. Thus, one may choose one ion species for milling or etching and choose a second different ion species for deposition.

For example, one may first introduce a gas such as Xe for sputtering. The Xe gas is ionized in ceramic plasma ion chamber 100 and an ionized Xe beam is formed. Sputtering occurs as the ionized Xe atoms collide with the substrate to be milled. After milling is completed, the plasma chamber may be evacuated. Then, one may introduce into the sample chamber through a gas injection system a flow of an etch-enhancing gas such as Xenon Di Fluoride ($XeF_2$) and provide to the plasma chamber a light inert element such as He. Etch enhancing gases are typically selective, and may increase the etch rate of some materials while decreasing the etch rate of others. The He gas is ionized in ceramic plasma ion chamber 100 and an ionized He beam is formed. The ionized He atoms bombard the molecules adsorbed to the surface to separate the Xe from the fluorine (F) atoms. At the substrate, where the ionized helium beam strikes the surface of the substrate, dissociated fluorine atoms bond with silicon (Si) atoms of the substrate to form volatile SiF. The Si atoms that bond with the F atoms leave the surface of the substrate. Thus, the substrate is chemically etched where it is impinged upon by the ionized He beam. The Xe and SiF gasses are evacuated from the chamber. Thus, some embodiments provide a multi-step process to provide different successive treatments of a work piece. For example, in a first step, a first ionizable gas can be introduced for sputtering and in a second step a second ionizable gas can be introduced for etching or deposition.

There are advantages to using an ionizable gas such as Xe for milling as compared to using a LMIS providing an element such as gallium (Ga). Suppose, for example, one desires to mill quartz glass to form an optically transmissive mask. Using a Ga LMIS for milling, some Ga atoms will embed in the quartz and undesirably disturb the optical transmissivity of the glass. In contrast, when using a heavy, non-reactive gas such as Xe, the ions do not remain in the quartz and an amorphous layer is formed at the surface of the quartz that is optically transmissive. Another disadvantage of an LMIS, in contrast to the present invention, is the inability to change ion species.

Use of an ion source that is excited by an RF field is preferable to an ion source that relies on cathode emission to produce electrons that ionize the gas. In a cathode-anode system some of the positive-ionized gas atoms collide with the cathode and sputter it. Also, use of a reactive gas results in deterioration of the cathode. This results in a relatively short lifetime for the cathode. In contrast, an RF excited system according to embodiments described herein has no cathode. Rather, free electrons are produced by applying a time-varying voltage to an aperture electrode. Due to the RF field produced by the coil around the plasma chamber, these free electrons travel circumferentially in the plasma chamber. The free electrons bombard other gas molecules to produce more ionized atoms. This in turn produces a plasma of very high ion density. Moreover, the beam can be focused to a submicron Gaussian-shaped spot or into a non-Gaussian shape, such as a rectangle, using known beam shaping techniques.

Thus, embodiments combine multiple gas sources, with RF plasma induction to offer an additional degree of freedom for milling, deposition, imaging, analysis, and other applications. The gas sources may comprise single atom species, molecules or gas mixtures. For insulator deposition, for example, to produce a layer of high resistivity, an oxygen primary ion species can be used to react with the work piece surface material to form an oxide material, such as silicon dioxide or a large ion such as Xe could be used with an appropriate precursor gas, such as TEOS or TMOS to deposit gallium free oxide that provides greater resistivity that an oxide layer having implanted gallium from a gallium beam. For quartz deposition, for example, to achieve high optical transmissivity, an inert or oxygen and silicon compound primary ion species may be used.

For minimal damage to a substrate, for example in a photoresist application, one might use a low mass primary ion such as He to produce minimal sputtering and high secondary electron yield. As another example, with carbon 60 ($C_{60}$) (or other structures, such as $C_{70}$, $C_{76}$, and $C_{84}$) as the primary ion type, one may perform direct carbon deposition without need for naphthalene. Applying carbon using $C_{60}$ is analogous to spray painting the carbon onto the work piece.

Enhanced deposition and milling rates may be achieved with $XeF_2$ or $SF_6$ plasma gases. Presumably, either of these gases flooded onto the sample will result in etch enhancement. Gains in deposition rates might also be achieved due to higher secondary electron yield of a fluorinated surface. In short, embodiments allow the user to choose the primary ion species with the best combination of factors such as: secondary electron yield, ion mass, secondary ion yield, sputter yield, etc.

In particular, for imaging, the use of a He ion beam is of great advantage since it may be expected to cause minimal sputtering of the sample when imaging. However, the use of an etching or deposition gas with the helium ion beam can provide etching or deposition giving zero-damage imaging with ion beam as well as etching and deposition functionality. For larger area etching or deposition, the use of heavier gases such as Xe may be expected to deliver more energy to the surface layer per ion, hence increasing the yield per ion.

Thus, embodiments provide for optimal choice of ion species for treatment of a substance. One species may be used for milling, another species may be used for deposition, another species may be used for etching, and yet another species may be used for imaging. The ability to select an optimal species for different treatments is a major advantage compared to using a single species LMIS as in the prior art. Use of a LMIS for milling results in metallic contamination of the specimen. In contrast, present embodiments enable use of an inert gas for milling. Use of a LMIS for deposition also results in contamination and lower deposition rates and further results in undesirable erosion. In contrast, present embodiments also enable use of an inert gas for deposition or an organometallic species for direct deposition without need for a precursor gas, resulting in faster deposition rates.

Figure 1B:
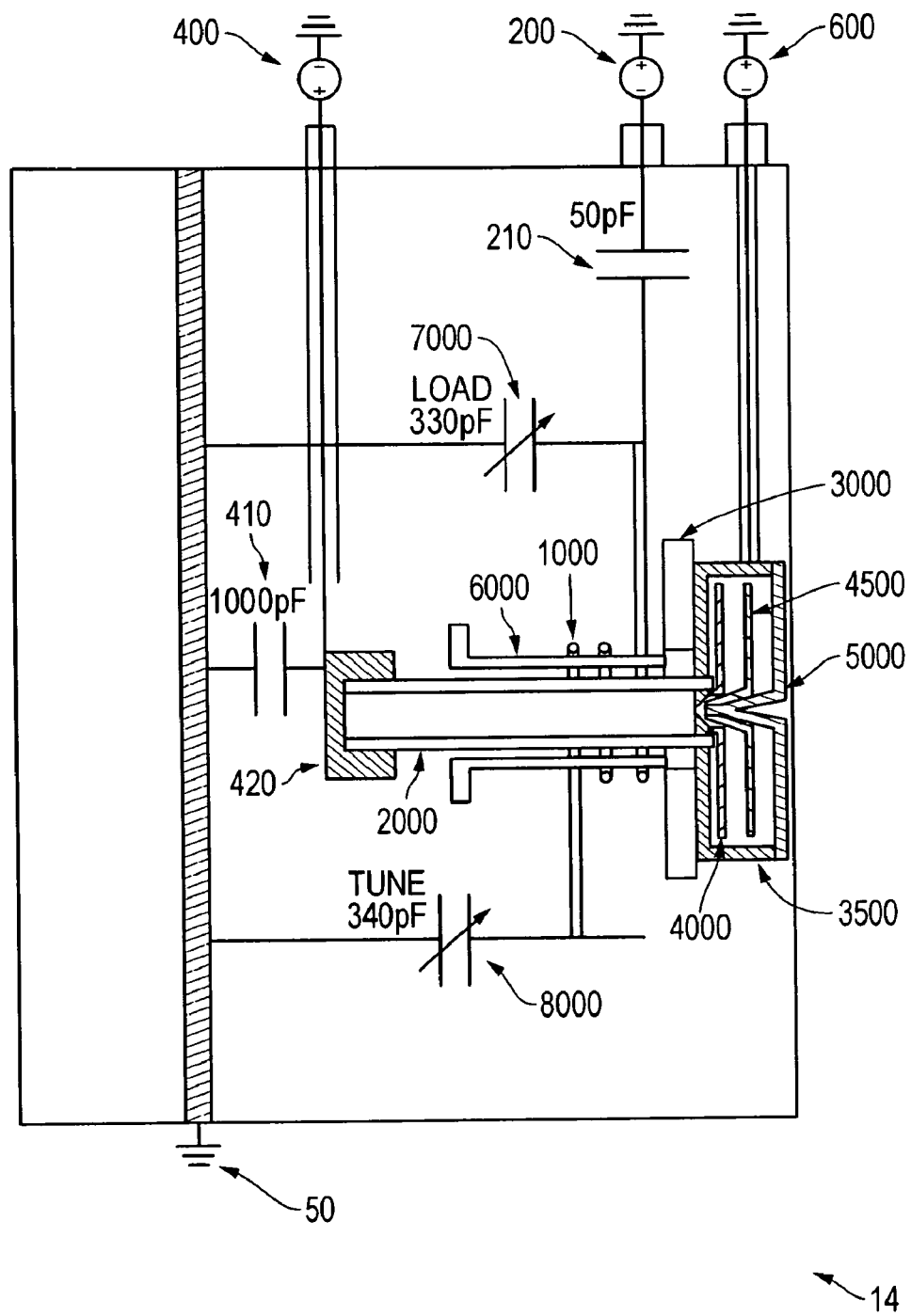
FIG. 1B shows an embodiment of an RF-excited ion plasma source.

FIG. 1B shows a more detailed diagram of an embodiment of a preferred ion plasma source 14. Such a system is described in U.S. patent application Ser. No. 10/988,745, published as U.S. Pat. Appl. Publ. No. 2005/0183667, entitled "Magnetically enhanced, inductively coupled plasma source for a focused ion beam system" which is incorporated herein by reference. A coil 1000 is capacitively coupled by impedance 210 to an RF source 200. Note that the capacitances shown in FIG. 1B are nominal values that readily can be selected by one of skill in the art according to the frequency of operation of the coil, as will be described further below. Coil 1000 is preferably a multi-turn coil that wraps around a dielectric plasma tube 2000 so that the axis of the coil substantially coincides with the axis of chamber 2000 and the beam axis.

When driven by RF source 200, coil 1000 forms a helical RF antenna. Driving the coil with an RF source can impart a time-varying potential to the plasma, due to capacitive coupling. That is, the coil can produce a radial electric field that modulates the plasma. This is undesirable because it creates a spread in the beam energy, resulting in chromatic aberration. However, in one embodiment, the antenna is driven at one end by a signal that is out of phase with the signal at the opposite end by as much as 180°. This creates a region interior to the coil where the potential fluctuations are substantially zero at all times. In this region there is substantially no time-varying modulation of the plasma arising from the time-varying voltage across the coil 1000. Thus, the phase of the antenna can be adjusted to minimize modulation of the ionization potential of the plasma in the region where ions are extracted in response to an applied acceleration field. The energy of the ions extracted from the plasma, according to this method, is substantially un-modulated by the RF voltage across the antenna.

However, source 200 does indeed cause electrons to move. Because of the orientation of the coil, free electrons in the plasma circulate around the plasma skin, causing them to collide with atoms to produce ions. This can produce plasma of very high ion density with relatively low thermal ion energy. A fixed-strength annular magnet about 5 to 10 millimeters thick, or a variable-strength electromagnet 3000, that produces an axial field strength of nominally 200 to 1000 Gauss may be placed between an end of the coil and a region 3500 of extraction, and is provided to increase plasma density. The magnet reduces electron diffusion and loss to the walls of the plasma chamber. Thus, the RF source is inductively coupled to the plasma and the annular magnet increases the plasma density in the extraction region.

A split Faraday shield 6000 can be used to screen out the capacitive field of the coil, but this is less desirable for two main reasons. First, a degree of capacitive coupling is required to ignite the plasma. Using a split Faraday shield usually requires another external power source (e.g., a Tesla coil) to ignite the plasma. Second, split Faraday shields typically result in some energy loss, due to Eddy currents induced in the shield. Without the split Faraday shield, the balanced antenna approach may still result in a sufficient time varying electric field in areas of the plasma chamber to cause the initial field ionization required to initiate the plasma.

A beam voltage 400 is electrically connected to a beam energy cap 420, which has an additional low pass filter 410 to ensure negligible RF pick-up to the beam voltage. An extractor voltage source 600, that is negative with respect to the potential applied to the source electrode 4000, is applied to the extraction electrode 4500. Skimmer electrode 5000 is at ground potential and provides an aperture through which the dense ion beam passes to produce an ion beam that can be focused with appropriate optics. Thus, the beam is extracted from the extraction region 3500, with a beam waist formed in the skimmer electrode 5000 aperture, and thus propagates along the beam axis in response to an applied acceleration. Alternatively, beam voltage 400 can be electrically connected directly to the source electrode 4000 instead of to the beam energy cap 420.

Figure 2:
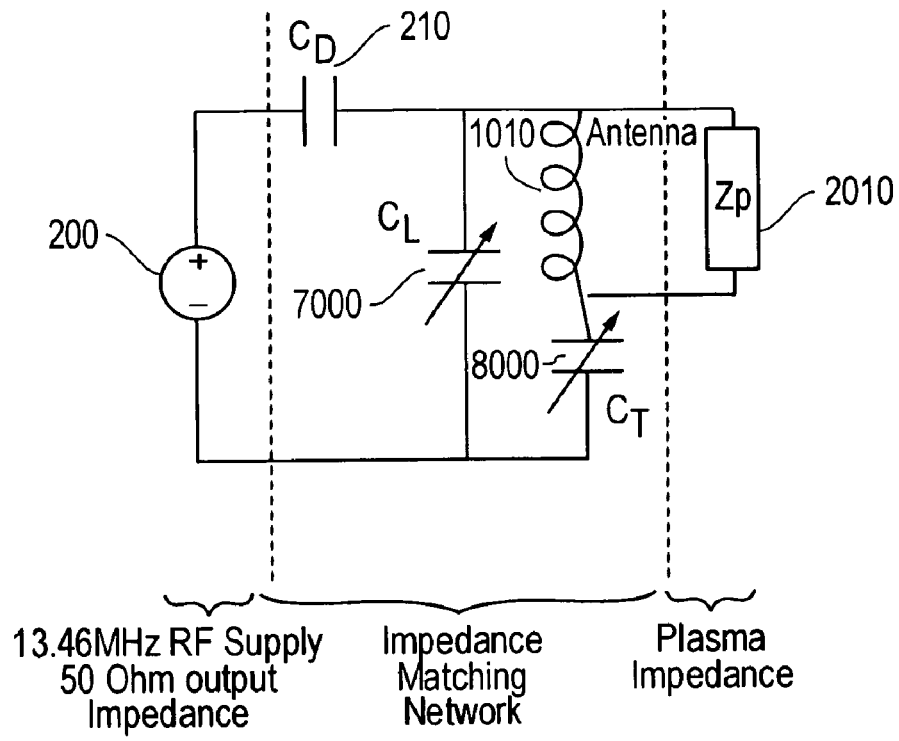
FIG. 2 shows a circuit for adjustment of power transfer to the plasma.

FIG. 2 shows a circuit of a preferred embodiment, including a plasma impedance. Zp, 2010 in parallel with an unknown coil inductance characteristic 1010. In series with the parallel combination of the plasma impedance 2010 and coil inductance 1010 is capacitance 8000. This parallel-series-parallel combination is in parallel with a second capacitance 7000. This series-parallel combination is in series with a third capacitance 210. This entire network is in parallel with the RF source 200. Clearly, the phase shift across the coil and plasma impedance can be controlled by the selection of capacitance values 210, 7000 and 8000.

One can therefore select capacitance values 210, 7000, and 8000 to obtain a phase shift across the coil and plasma of 180 degrees. Thus, some embodiments provide a circuit adjustment to achieve a maximum transfer of power to the plasma, with negligible modulation of the plasma potential, resulting in negligible axial energy spread of the extracted ions.

The embodiment described above minimizes the effects of capacitive coupling on the ions, leaving only the influence of the pre-sheath potential gradient. The potential gradient of the pre-sheath region is finite, but small, and is generally about half the mean electron energy (Te), where Te is only 3 eV for the type of source described above, giving an inescapable lower limit to the axial energy spread ($\Delta$E) of ~1.5 eV.

Embodiments may be conveniently operated at low RF power, nominally imparting 25 W to the plasma. At this power level a brightness of ~200 Acm$^{-2}$sr$^{-1}$ can be generated at only 5 keV with an ion current density of 19.6 mA cm$^{-2}$. This implies a thermal energy of $\leq$0.15 eV and a plasma density of ~8×10$^{11}$ cm$^{-3}$. Pulse plasma densities of 1×10$^{14}$ ions cm$^{-3}$ have been attained with this source, implying that a source brightness of >1×10$^5$ A cm$^{-2}$ sr$^{-1}$ is obtainable at a beam energy of 50 keV, with current density of: $J_i=0.6 n_i q \sqrt{k_B T_e/M_i}$~2.4 Acm$^{-2}$, where $E_0$=50 keV, and $E_\perp$=0.15 eV. This yields a beam brightness, $$\beta_{max} = \frac{J_i E_0}{\pi E_\perp} > 1\times 10^5 A cm^{-2} sr^{-1}.$$

Thus, one embodiment is an ion beam system comprising a plurality of source gases for which a first and then at least a second gas are coupled sequentially to a vessel that encloses a region of plasma. An antenna in proximity to the vessel is excited by an RF electrical source to induce ionization of the plasma. Compensation circuitry couples the antenna to the electrical source to substantially reduce oscillations in the ionized plasma. An extraction mechanism extracts the ionized plasma into a beam of high current.

Figure 3:
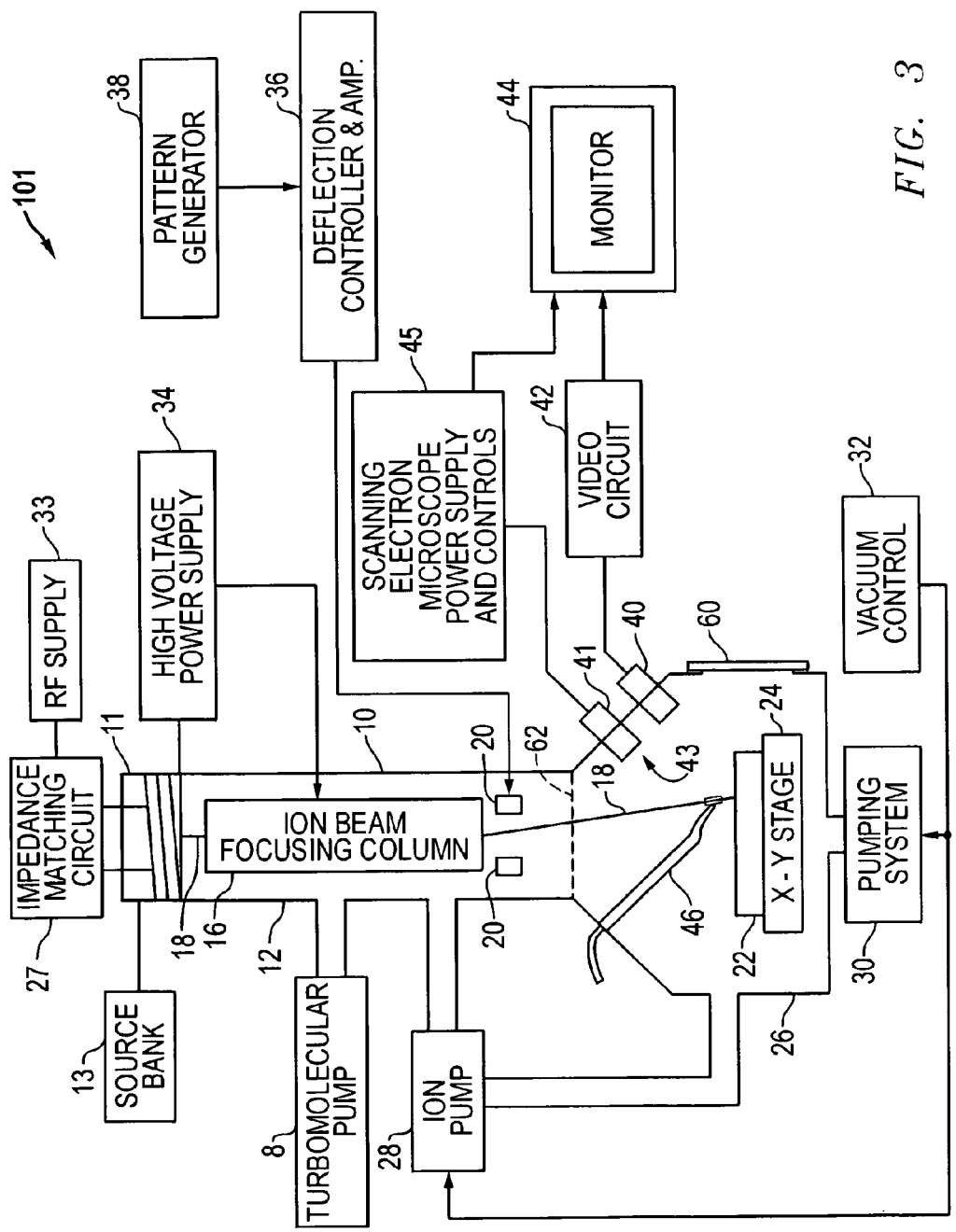
FIG. 3 shows an embodiment of a focused ion beam system.

FIG. 3 shows an embodiment of a focused ion beam system 101 that includes an evacuated envelope 10 in which is located a plasma source 11 with an RF antenna with RF supply 33, and impedance matching circuit 27, implemented as described above, to provide a dense plasma for ion beam focusing column 16. Connected to the plasma source 11 is a bank of sources 13 to provide different ionizable gases for ionization. Ion beam 18 passes from plasma source 11 through column 16 and between electrostatic deflection mechanism 20 toward specimen 22, which comprises, for example, a semiconductor device positioned on movable X-Y stage 24 within lower chamber 26.

A turbo-molecular pump 8 is employed for evacuating the source and maintaining high vacuum in the upper column optics region. The vacuum system provides within lower chamber 26 a vacuum of typically between approximately 1×10$^{-7}$ Torr (1.3×10$^{-7}$ mbar) and 5×10$^{-4}$ Torr (6.5×10$^{-4}$ mbar) with nominally 10 mTorr (1.3×10$^{-3}$ mbar) in the plasma source and <1×10$^{-6}$ Torr (1.3×10$^{-6}$ mbar) in the column optics chamber.

High voltage power supply 34 may be connected to electrodes of plasma source 11 as well as to electrodes in focusing column 16 for forming an approximately 0.1 keV to 50 keV ion beam 18 and directing the same downward. RF power supply 33 and impedance matching circuit 27 is also provided to energize a coil of plasma ion source 11, as described above. Deflection controller and amplifier 36, operated in accordance with a prescribed pattern provided by pattern generator 38, is coupled to deflection plates 20 whereby beam 18 may be controlled to trace out a corresponding pattern on the upper surface of specimen 22. In some systems, the deflection plates are placed before the final lens, as is well known in the art.

The beam from ion plasma source 11 is brought to a focus at specimen 22 for either modifying or imaging the surface 22. A charged particle multiplier 40 used for detecting secondary ion or electron emission for imaging is connected to video circuit 42, the latter supplying drive for video monitor 44 also receiving deflection signals from controller 36. The location of charged particle multiplier 40 within lower chamber 26 can vary in different embodiments. For example, a preferred charged particle multiplier 40 can be coaxial with the ion beam and include a hole for allowing the ion beam to pass. A scanning electron microscope 41, along with its power supply and controls 45, are optionally provided with the FIB system 101.

Signals applied to deflection controller and amplifier 36, cause the focused ion beam to move within a target area to be imaged or milled according to a pattern controlled by pattern generator 38. Emissions from each sample point are collected by charged particle multiplier 40 to create an image that is displayed on video monitor 44 by way of video circuit 42. An operator viewing the image may adjust the voltages applied to various optical elements in column 16 to focus the beam and adjust the beam for various aberrations.

Focusing optics in column 16 may comprise mechanisms known in the art for focusing or methods to be developed in the future. For example, two cylindrically symmetric electrostatic lenses can be implemented to produce a demagnified image of the round virtual source. Because of the low axial energy spread in the extracted beam, chromatic blur is minimal and efficient focusing of the beam can be achieved even at low acceleration voltages (i.e., low beam energies). These properties in conjunction with appropriate focusing optics can be used to generate nanometer, to micrometer scale spot sizes with a range of kinetic energies (about 0.1 keV to about 50 keV) and beam currents.

The realization of very high plasma densities (up to about 1014/cm$^3$), low thermal ion energies (down to about 0.1 eV), low axial energy spread (about 1.5 eV to about 3 eV), the ability to operate with either inert or reactive gases, and the potential for very long life due to minimal erosion of source materials, makes a magnetically enhanced, inductively coupled plasma source ideal to be used in conjunction with probe forming FIB optics.

Embodiments can provide beam currents from about a few pico-amperes to about several micro-amperes. A source brightness of at least about $10^4$ A/cm$^2$/sr, up to about $10^6$ A/cm$^2$/sr at about 50 keV can be achieved. The axial energy spread is less than about 3 eV and could be as low as about 1.5 eV. This contrasts sharply with present day LMISs, which can provide a beam brightness on the order of about 106 A/cm$^2$/sr, but with an energy spread on the order of about 5 eV. Also, LMIS sources are generally only suitable for generation of beam currents in the picoampere to nanoampere range.

Figure 3B:
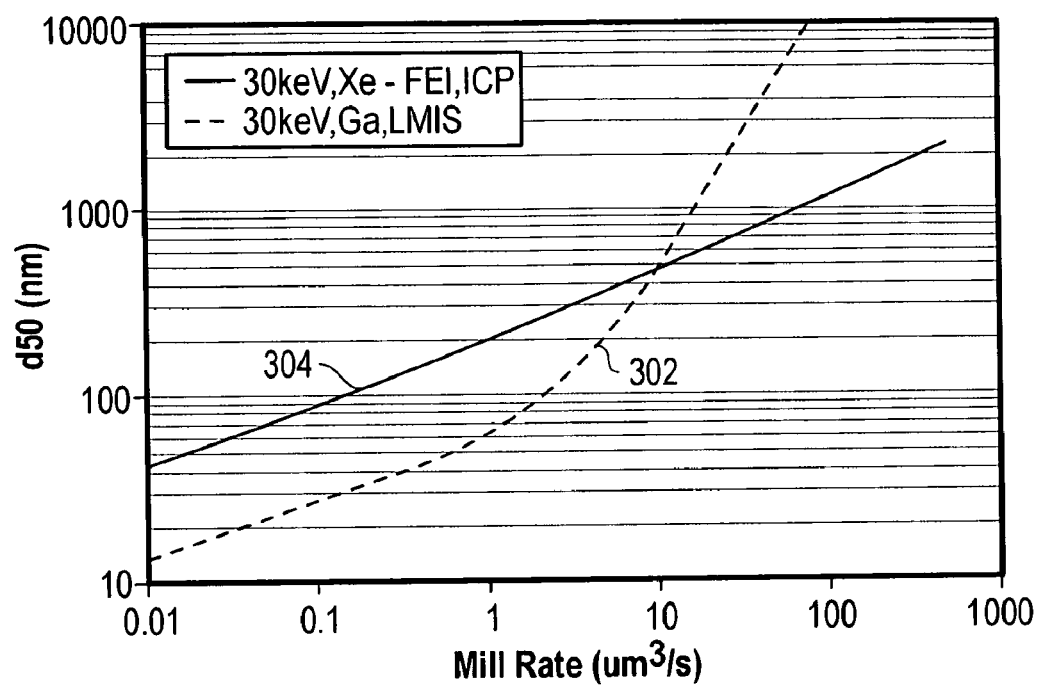
FIG. 3B shows a graph of performance of both a LMIS and a magnetically induced plasma ion source

Thus, the plasma sources described above can provide a submicron spot size with a beam brightness of greater than $10^3$-$10^5$ Acm$^{-2}$sr$^{-1}$ and an axial energy spread less than about 1.5-3.0 eV, which makes the plasma source suitable for micromachining or deposition of submicron features. FIG. 3B shows a graph of performance of both a LMIS and a magnetically induced plasma ion source as described herein. The horizontal axis is the rate of removal of material, in this case silicon. The vertical axis is a measure of the size of the beam. The white curve 302 is shows the rate of material removal versus beam size for a Gallium LMIS focused ion beam. The black curve 304 shows the rate of removal versus beam size for a magnetically induced plasma ion source. The curve 302 lies below the curve 304 to the left and then rises above the curve 304 to the right. Clearly, in the region where the curve 304 lies below the curve 302, the magnetically induced focused ion beam offers a greater milling rate for a given beam size. With the magnetically induced plasma ion beam, one can achieve a spot size of less than 200 nanometers with a beam Current exceeding 50 nano-amperes.

A further advantage of embodiments of the invention is the ability to operate with any inert gas as well as many reactive gases, (e.g., $O_2$, $N_2$, $SF_6$, etc. . . . ). The ion beam is capable of being focused into a beam diameter of a few nanometers (submicron), up to several tens of micrometers. Inert gas beams can readily be generated making embodiments suitable for applications where gallium or other metallic ion beams might be problematic.

Figure 4:
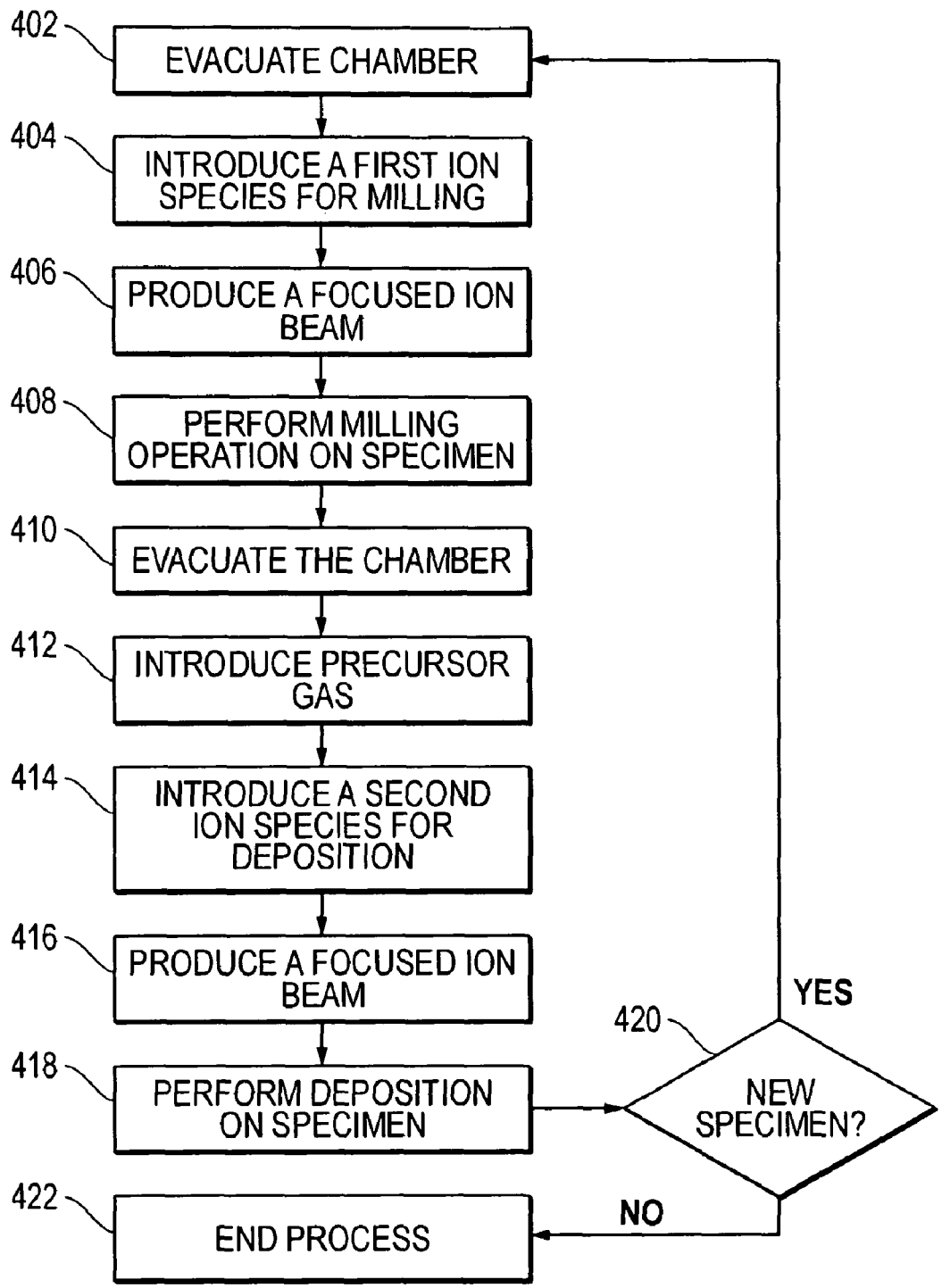
FIG. 4 shows a flow chart of an embodiment of a process for milling and deposition using a multi-source, magnetically induced ion beam system.

FIG. 4 shows a flow chart of an embodiment of a process for milling or etching and deposition using a multi-source, magnetically induced ion beam system as described herein. First, the system evacuates the chamber that contains a specimen (element 402). Then, the system introduces a first ion species such as Xe selected by a user for milling (element 404). Note that in one embodiment an etch-enhancing gas, such as $XeF_2$ or $I_2$, may be directed to the work piece while directing the first ion species to the work piece. The system produces a focused or shaped ion beam (element 406) and milling is performed using this ion species (element 408). When milling is completed, the system evacuates the chamber (element 410). The system may then introduce a precursor gas such as tungsten hexacarbonyl (element 412). Then, the user selects a second ion species such as He to be used for deposition (element 414). The system produces a focused ion beam (element 416) and performs deposition, with the helium ions providing energy to dissociate the tungsten hexacarbonyl to deposit tungsten on the specimen (element 418). If another specimen is to be treated, (element 420), the process begins anew (element 402). Otherwise, the process ends (element 422). Note that in a different process deposition may be performed followed by etching.

Embodiments also provide for deposition of a metal using an ionized gas containing metal atoms For example, tungsten may be deposited by ionizing tungsten hexacarbonyl. Ionization of this gas results in relatively fast tungsten deposition compared to depositing to tungsten through a gas injection system and then causing bombardment by an ion beam to cause vibrations which disassociate the tungsten from the carbon, leaving the tungsten on the surface.

Thus, one embodiment of an ion beam system for treatment of a specimen comprises an organometallic gas coupled to a plasma chamber. A helical antenna is positioned around the plasma chamber and excited to ionize the organometallic gas within the plasma chamber. Circuitry in a network comprising the antenna impedance matches a source of excitation to the antenna. An extraction mechanism extracts an ionized organometallic beam for deposition of the metal of the beam onto a specimen.

Figure 5:
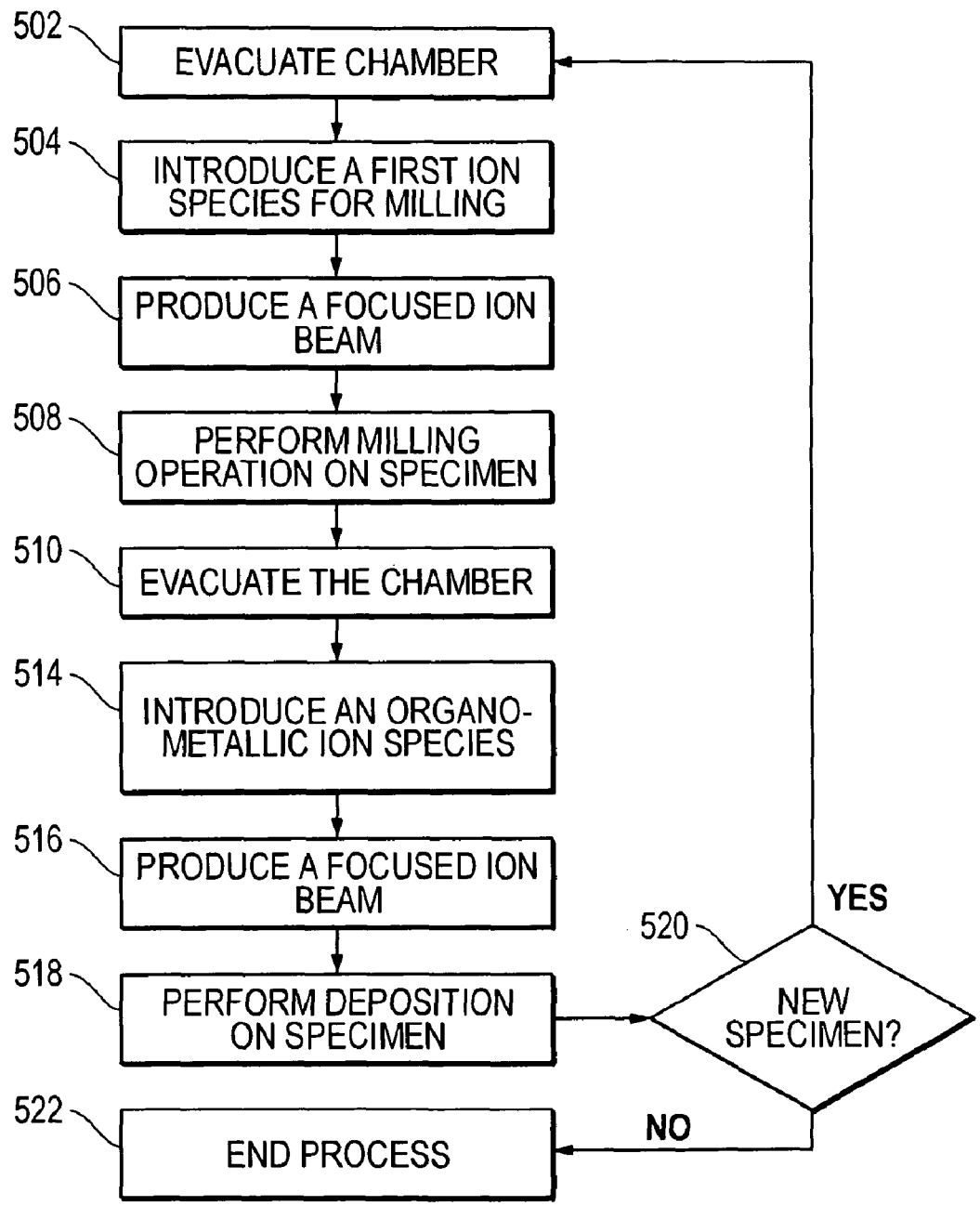
FIG. 5 shows a flow chart of an embodiment of a process for milling and deposition using an organometallic ion species.

FIG. 5 shows a flow chart of an embodiment for milling followed by deposition using an organometallic ion species. First, the system evacuates the chamber that contains a specimen (element 502). Then, the system introduces a first ion species selected by a user for milling (element 504). The system produces a focused ion beam (element 506) and milling is performed using this ion species (element 508). When milling is completed, the system evacuates the chamber (element 510). Then the user selects an organometallic ion species such as tungsten hexacarbonyl to be used for deposition (element 514). In another embodiment, $C_{60}$ may be employed for depositing a resistive layer on the specimen. Thus, a step of introducing a precursor gas may be omitted. The system produces a focused organometallic ion beam (element 516) and performs direct deposition upon the specimen (element 518). If another specimen is to be treated, (element 520), the process begins anew (element 502). Otherwise, the process ends (element 522).

As another example, the invention can be used for "circuit edit," in which an integrated circuit is modified in a series of steps. For example, a buried conductor may be exposed by milling a hole in the circuit using a focused ion beam of inert ions and an etch-enhancing gas (either in the beam or introduced separately) that preferentially etches oxides to expose. The buried conductor may be severed using a focused beam of inert ions and an etch-enhancing gas that is selective for metal etching. The hole is then filled using by ion beam deposition of an insulator, for example, using an inert ion and TEOS as the precursor gas.

In another example of circuit edit, two buried conductors may be exposed as described above, and then the conductors can be connected using ion beam deposition of a metal using an inert ion and an organometallic precursor gas. If necessary, an insulating layer can be deposited to cover any conductors on the surface before the holes are milled.

Although the present invention and some of its advantages have been described in detail, it should be understood that various changes, substitutions and alterations can be made herein without departing from the spirit and scope of the invention as defined by the appended claims. For example, while most embodiments are described using a focused ion beam, the term should be understood to include a shaped ion beam. Because the invention can be used in different applications for different purposes, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of charged particle beam processing, comprising:
   providing an ion beam system having a first gas supply and a second gas supply, the first and second gas supplies being selectively connected to the plasma chamber of an ion source for producing ions of a first type or ions of a second type, respectively, the ion beam system including focusing optics for forming a beam of ions extracted from the plasma chamber;
   selectively causing a gas from the first gas supply to enter the plasma chamber; and
   processing a work piece using a beam of ions of the first type extracted from the plasma chamber;
   selectively causing a gas from the second gas supply to enter the plasma chamber;
   processing the work piece using a beam of ions of the second type extracted from the plasma chamber, in which the work piece is not removed from the vacuum chamber and the vacuum chamber is not exposed to atmosphere between processing the work piece using the beam of ions of a first type and processing the work piece using the beam of ions of a second type.

2. The method of claim 1 in which the ion source comprises a RF-excited, impedance matched plasma chamber for receiving an ion species and extracting an ion beam from the plasma chamber.

3. The method of claim 2 in which the impedance matched plasma chamber is coupled to impedance matching circuitry that is adjustable to vary an amount of power transferred to the plasma for a particular selected ion species.

4. The method of claim 1 in which processing a work piece using a beam of ions of the first type includes directing a beam having a submicron spot size toward the work piece and in which processing a work piece using a beam of ions of the second type includes locally directing a beam having a submicron spot size toward the work piece.

5. The method of claim 1 in which processing a work piece using a beam of ions of the first type includes processing the work piece using a Gaussian shaped ion beam.

6. The method of claim 1 in which processing a work piece using a beam of ions of a first type or processing a work piece using a beam of ions of a second type includes processing the work piece by one of the following processes:
   depositing material using ion beam induced deposition or direct material deposition;
   removing material using ion beam sputtering or chemically-enhanced ion beam etching;
   forming an image of the work piece using ion beam imaging; or
   analyzing the composition of the work piece using secondary ion mass spectroscopy.

7. The method of claim 1 in which processing a work piece using a beam of ions of a first type or processing a work piece using a beam of ions of a second type includes directing a beam of inert ions or a beam of reactive ions at the work piece.

8. The method of claim 1 in which processing a work piece using a beam of ions of the first type or processing a work piece using a beam of ions of the second type includes directing a beam of ions to deposit a material on the work piece surface.

9. The method of claim 8 in which directing a beam of ions to deposit a material on the work piece surface includes directing a beam of ions that include atoms other than those to be deposited and that decompose to deposit the atoms of the desired deposit material.

10. The method of claim 8 in which directing a beam of ions to deposit a material on the work piece surface includes directing a beam of ions that include atoms only of the material to be deposited.

11. The method of claim 1 in which processing a work piece using a beam of ions of a first type includes directing a beam comprising ions of at least two chemical compositions or in which locally processing a work piece using a beam of ions of a second type includes directing a beam comprising ions of at least two chemical compositions.

12. The method of claim 1 in which processing a work piece using a beam of ions of a first type or processing a work piece using a beam of ions of a second type includes directing a gas toward the work piece from a gas injection system, the gas comprising a precursor gas that decomposes in the presence of the ion beam to deposit a material onto the work piece surface or an etch-enhancing gas that reacts in the presence of the ion beam to remove material from the surface.

13. An ion beam system, comprising:
   a plurality of source gas connections for connecting multiple source gases to a vessel that encloses a region of plasma;
   a vessel enclosing the region of plasma;
   an antenna in proximity to the vessel, the antenna excited by an RF electrical source to induce ionization of the plasma;
   circuitry that couples the antenna to the electrical source to substantially reduce oscillations in the ionized plasma; and
   an extraction mechanism to extract the ionized plasma into a beam.

14. The system of claim 13, further comprising charged particle beam optics for focusing the beam into a Gaussian shape.

15. The system of claim 13, wherein the source gas connections selectively couples a source of an inert gas or a source of a reactive gas to the plasma chamber.

16. The system of claim 13, wherein the source gas connections selectively couples to the vessel a first gas used for deposition and a second gas used for etching.

17. The system of claim 13, wherein a gas coupled to the vessel comprises a source that decomposes on the work piece surface to deposit a material or a gas that combined with the material on the surface to form a volatile reaction product, thereby etching the surface, or that forms a non-volatile reaction product that remains on the surface.

18. The system of claim 13, wherein the system exhibits an energy spread that is less than about 4 eV.

19. The system of claim 13, further comprising a focusing mechanism that produces a beam of high brightness exceeding 1000 A/cm$^2$/sr.

20. The system of claim 13, wherein an extracted beam exhibits an extracted beam energy of about 8 keV or greater.

21. The system of claim 13, wherein an extracted beam exhibits a current exceeding about 50 nano-amperes and is focused to a spot size of less than 200 nanometers.

22. The system of claim 13, wherein the beam formed from a selected gas is focused to a submicron spot size.

23. An ion beam system for treatment of a specimen, comprising:
- an organometallic gas coupled to a plasma chamber;
- a plasma chamber to which the organometallic gas is coupled;
- a helical antenna positioned around the plasma chamber and excited to ionize the organometallic gas within the plasma chamber;
- circuitry in a network comprising the antenna to impedance-match a source of excitation to the antenna; and
- an extraction mechanism for extracting an ionized organometallic beam for deposition of the metal of the beam onto a specimen.

24. The system of claim 23, wherein the circuitry comprises a capacitance in series with a parallel combination of a capacitance and the helical antenna.

25. The system of claim 23, wherein the organometallic gas is tungsten hexacarbonyl.

26. The system of claim 23, wherein the beam is focused to a submicron spot size.

27. A method for producing an ion beam, comprising:
- providing a plurality of different gas sources to be individually and sequentially selected to be coupled to a plasma chamber;
- providing circuitry coupled to an antenna to reduce modulation of a plasma potential;
- selectively coupling to the plasma chamber a first one of the plurality of different gases and then at least a second one of the plurality of gases;
- applying RF power to an antenna that couples energy to the selected gas within the chamber to induce ionization of a gas to produce an ion plasma; and
- extracting an ionized beam from a region of extraction in proximity to the antenna.

28. The method of claim 27, wherein one selected gas is used for etching and another selected gas is used for deposition.

29. The method of claim 27, wherein the circuitry is adjustable to vary an amount of power transferred to the plasma for a particular selected gas.

* * * * *

UNITED STATES PATENT AND TRADEMARK OFFICE
CERTIFICATE OF CORRECTION

PATENT NO. : 8,076,650 B2
APPLICATION NO. : 12/373676
DATED : December 13, 2011
INVENTOR(S) : Noel Smith et al.

It is certified that error appears in the above-identified patent and that said Letters Patent is hereby corrected as shown below:

In the Specifications:

1. Column 14, Line 16 – Please change "which locally processing" to read "which processing".

Signed and Sealed this
Twenty-fifth Day of June, 2013

Teresa Stanek Rea
*Acting Director of the United States Patent and Trademark Office*